(12) United States Patent
Sun et al.

(10) Patent No.: US 11,031,567 B2
(45) Date of Patent: Jun. 8, 2021

(54) EFFICIENT SOLAR CELLS USING ALL-ORGANIC NANOCRYSTALLINE NETWORKS

(75) Inventors: Kai Sun, Ann Arbor, MI (US); Fan Yang, Piscataway, NJ (US); Stephen R. Forrest, Ann Arbor, MI (US)

(73) Assignee: The Regents of the University of Michigan, Ann Arbor, MI (US)

( * ) Notice: Subject to any disclaimer, the term of this patent is extended or adjusted under 35 U.S.C. 154(b) by 679 days.

(21) Appl. No.: 11/880,210

(22) Filed: Jul. 19, 2007

(65) Prior Publication Data
US 2010/0025663 A1 Feb. 4, 2010

Related U.S. Application Data

(63) Continuation-in-part of application No. 11/561,448, filed on Nov. 20, 2006, now Pat. No. 7,897,429, and
(Continued)

(51) Int. Cl.
*H01L 51/42* (2006.01)
*B82Y 10/00* (2011.01)
(Continued)

(52) U.S. Cl.
CPC .......... *H01L 51/4246* (2013.01); *B82Y 10/00* (2013.01); *H01L 51/4253* (2013.01);
(Continued)

(58) Field of Classification Search
CPC ..................................................... H01L 51/42
See application file for complete search history.

(56) References Cited

U.S. PATENT DOCUMENTS 6,333,458 B1 12/2001 Forrest et al.
6,352,777 B1 3/2002 Bulovic et al.
(Continued)

FOREIGN PATENT DOCUMENTS

JP 2003-523090 7/2003
JP 2004-214015 7/2004
(Continued)

OTHER PUBLICATIONS

International Search Report for PCT Application Serial No. PCT/US08/070208, dated Nov. 6, 2008.
(Continued)

*Primary Examiner* — Marvin Payen
(74) *Attorney, Agent, or Firm* — Finnegan, Henderson, Farabow, Garrett & Dunner, LLP

(57) ABSTRACT

An optoelectronic device and a method of fabricating a photosensitive optoelectronic device includes depositing a first organic semiconductor material on a first electrode to form a continuous first layer; depositing a layer of a second organic semiconductor material on the first layer to form a discontinuous second layer, portions of the first layer remaining exposed; and depositing the first organic semiconductor material on the second layer to form a discontinuous third layer, portions of at least the second layer remaining exposed. The depositing of the first and second organic semiconductor materials are alternated a number of times until a final layer of the second organic material is added to form a continuous layer. A second electrode is deposited over this final layer. One of the first electrode and the second electrode is transparent, and the first organic semiconductor material is one or more donor-type materials or one or more acceptor-type materials relative to second organic semiconductor material, which is one or more materials of the other material type.

6 Claims, 9 Drawing Sheets

Related U.S. Application Data a continuation-in-part of application No. 11/483,641, filed on Jul. 11, 2006, now Pat. No. 7,638,356.

(51) Int. Cl.
*H01L 51/00* (2006.01)
*H01L 27/30* (2006.01)

(52) U.S. Cl.
CPC ........ *H01L 27/302* (2013.01); *H01L 51/0008* (2013.01); *H01L 51/0046* (2013.01); *H01L 51/0078* (2013.01); *Y02E 10/549* (2013.01)

(56) References Cited

U.S. PATENT DOCUMENTS

| | | | |
|---|---|---|---|
| 6,420,031 | B1 | 7/2002 | Parthasarathy et al. |
| 6,440,769 | B2 | 8/2002 | Peumans et al. |
| 6,451,415 | B1 | 9/2002 | Forrest et al. |
| 6,580,027 | B2 | 6/2003 | Forrest et al. |
| 6,657,378 | B2 | 12/2003 | Forrest et al. |
| 7,196,366 | B2 | 3/2007 | Forrest et al. |
| 7,196,835 | B2 | 3/2007 | Peumans et al. |
| 2002/0119297 | A1* | 8/2002 | Forrest et al. ............... 428/199 |
| 2005/0061364 | A1* | 3/2005 | Peumans et al. ............ 136/263 |
| 2005/0110007 | A1 | 5/2005 | Forrest et al. |
| 2005/0123676 | A1 | 6/2005 | Kuwahara et al. |
| 2005/0224113 | A1 | 10/2005 | Xue et al. |
| 2005/0227390 | A1 | 10/2005 | Shtein et al. |
| 2005/0266218 | A1 | 12/2005 | Peumans et al. |
| 2006/0027801 | A1 | 2/2006 | Forrest et al. |
| 2006/0027802 | A1 | 2/2006 | Forrest et al. |
| 2006/0032529 | A1 | 2/2006 | Rand et al. |

FOREIGN PATENT DOCUMENTS

| | | |
|---|---|---|
| JP | 2004-263241 | 9/2004 |
| JP | 2005-146361 | 6/2005 |
| WO | WO 1995/27314 A1 | 10/1995 |
| WO | WO 2001/59854 A1 | 8/2001 |
| WO | WO 2005-101524 | 10/2005 |
| WO | WO 2007-055931 | 5/2007 |
| WO | WO 2008/63519 A2 | 5/2008 |

OTHER PUBLICATIONS

Miessler G.L. et al. 1999. Chapter 1 *Introduction to Inorganic Chemistry*, 2nd Edition, Chapter 1, Introduction to Inorganic Chemistry, pp. 1-3; Chapter 13, Organometallic Chemistry, pp. 422-424, 442 of Inorganic Chemistry. Upper Saddle River, NJ: Prentice-Hall, 1999 (Aug. 1999 Reprinted Edition).

Peumans P. et al. 2000. American Institute of Physics, "Efficient photon harvesting at high optical intensities in ultrathin organic double-heterostructure photovoltaic diodes". Applied Physics Letters, vol. 76, No. 19, May 8, 2000, pp. 2650-2652.

Xue, et al. A Hybrid Planar-Mixed Molecular Heterojunction Photovoltaic Cell. Advanced Materials, Wiley VCH, Weinheim, DE, vol. 17, No. 1, Jan. 18, 2005, pp. 66-71.

Yang, F. et al. Controlled Growth of a Molecular Bulk Heterojunction Photovoltaic Cell. Nature Materials, Nature Publishing Group, London, GB, vol. 4, No. 1; Jan. 1, 2005, pp. 37-41.

\* cited by examiner

EFFICIENT SOLAR CELLS USING ALL-ORGANIC NANOCRYSTALLINE NETWORKS

RELATED APPLICATIONS

The present application is a continuation-in-part of U.S. Ser. No. 11/561,448 filed on Nov. 20, 2006, now U.S. Pat. No. 7,897,429 and is a continuation-in-part of U.S. Ser. No. 11/483,641 filed on Jul. 11, 2006, now U.S. Pat. No. 7,638,356 the disclosures of which are hereby incorporated in its entirety.

UNITED STATES GOVERNMENT RIGHTS

This invention was made with U.S. Government support under Grant No. DE-AC36-98-GO10337 and sub-contract XAT 5-33636-03 awarded by U.S. Department of Energy, National Renewable Energy Laboratory. The government has certain rights in this invention.

JOINT RESEARCH AGREEMENT

The claimed invention was made by, on behalf of, and/or in connection with one or more of the following parties to a joint university-corporation research agreement: Princeton University, The University of Southern California, and Global Photonic Energy Corporation. The agreement was in effect on and before the date the claimed invention was made, and the claimed invention was made as a result of activities undertaken within the scope of the agreement.

FIELD OF THE INVENTION

The present invention generally relates to organic photosensitive optoelectronic devices. More specifically, it is directed to organic photosensitive optoelectronic devices having all-organic nanocrystalline networks in its active regions.

BACKGROUND

Optoelectronic devices rely on the optical and electronic properties of materials to either produce or detect electromagnetic radiation electronically or to generate electricity from ambient electromagnetic radiation.

Photosensitive optoelectronic devices convert electromagnetic radiation into an electrical signal or electricity. Solar cells, also called photovoltaic ("PV") devices, are a type of photosensitive optoelectronic device that is specifically used to generate electrical power. Photoconductor cells are a type of photosensitive optoelectronic device that are used in conjunction with signal detection circuitry which monitors the resistance of the device to detect changes due to absorbed light. Photodetectors, which may receive an applied bias voltage, are a type of photosensitive optoelectronic device that are used in conjunction with current detecting circuits which measures the current generated when the photodetector is exposed to electromagnetic radiation.

These three classes of photosensitive optoelectronic devices may be distinguished according to whether a rectifying junction as defined below is present and also according to whether the device is operated with an external applied voltage, also known as a bias or bias voltage. A photoconductor cell does not have a rectifying junction and is normally operated with a bias. A PV device has at least one rectifying junction and is operated with no bias. A photodetector, a type of PV device, has at least one rectifying junction and is usually but not always operated with a bias.

As used herein, the term "rectifying" denotes, inter alia, that an interface has an asymmetric conduction characteristic, i.e., the interface supports electronic charge transport preferably in one direction. The term "semiconductor" denotes materials which can conduct electricity when charge carriers are induced by thermal or electromagnetic excitation. The term "photoconductive" generally relates to the process in which electromagnetic radiant energy is absorbed and thereby converted to excitation energy of electric charge carriers so that the carriers can conduct (i.e., transport) electric charge in a material. The term "photoconductive material" refers to semiconductor materials which are utilized for their property of absorbing electromagnetic radiation to generate electric charge carriers. As used herein, "top" means furthest away from the substrate, while "bottom" means closest to the substrate. There may be intervening layers (for example, if a first layer is "on" or "over" a second layer), unless it is specified that the first layer is "in physical contact with" or "directly on" the second layer; however, this does not preclude surface treatments (e.g., exposure of the first layer to ultraviolet-ozone or a plasma).

When electromagnetic radiation of an appropriate energy is incident upon an organic semiconductor material, a photon can be absorbed to produce an excited molecular state. In organic photoconductive materials, the generated molecular state is generally believed to be an "exciton," i.e., an electron-hole pair in a bound state which is transported as a quasi-particle. An exciton can have an appreciable life-time before geminate recombination ("quenching"), which refers to the original electron and hole recombining with each other (as opposed to recombination with holes or electrons from other pairs). To produce a photocurrent, the electron-hole forming the exciton are typically separated at a rectifying junction.

In the case of photosensitive devices, the rectifying junction is referred to as a photovoltaic heterojunction. Types of organic photovoltaic heterojunctions include a donor-acceptor heterojunction formed at an interface of a donor material and an acceptor material, and a Schottky-barrier heterojunction formed at the interface of a photoconductive material and a metal.

FIG. 1 is an energy-level diagram illustrating an example donor-acceptor heterojunction. In the context of organic materials, the terms "donor" and "acceptor" refer to the relative positions of the Highest Occupied Molecular Orbital ("HOMO") and Lowest Unoccupied Molecular Orbital ("LUMO") energy levels of two contacting but different organic materials. If the LUMO energy level of one material in contact with another is lower, then that material is an acceptor. Otherwise it is a donor. It is energetically favorable, in the absence of an external bias, for electrons at a donor-acceptor junction to move into the acceptor material.

As used herein, a first HOMO or LUMO energy level is "greater than" or "higher than" a second HOMO or LUMO energy level if the first energy level is closer to the vacuum energy level 10. A higher HOMO energy level corresponds to an ionization potential ("IP") having a smaller absolute energy relative to a vacuum level. Similarly, a higher LUMO energy level corresponds to an electron affinity ("EA") having a smaller absolute energy relative to vacuum level. On a conventional energy level diagram, with the vacuum level at the top, the LUMO energy level of a material is higher than the HOMO energy level of the same material.

After absorption of a photon 6 in the donor 152 or the acceptor 154 creates an exciton 8, the exciton 8 disassociates at the rectifying interface. The donor 152 transports the hole (open circle) and the acceptor 154 transports the electron (dark circle).

A significant property in organic semiconductors is carrier mobility. Mobility measures the ease with which a charge carrier can move through a conducting material in response to an electric field. In the context of organic photosensitive devices, a material that conducts preferentially by electrons due to a high electron mobility may be referred to as an electron transport material. A material that conducts preferentially by holes due to a high hole mobility may be referred to as a hole transport material. A layer that conducts preferentially by electrons, due to mobility and/or position in the device, may be referred to as an electron transport layer ("ETL"). A layer that conducts preferentially by holes, due to mobility and/or position in the device, may be referred to as a hole transport layer ("HTL"). Preferably, but not necessarily, an acceptor material is an electron transport material and a donor material is a hole transport material.

How to pair two organic photoconductive materials to serve as a donor and an acceptor in a photovoltaic heterojunction based upon carrier mobilities and relative HOMO and LUMO levels is well known in the art, and is not addressed here.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule." In general, a small molecule has a defined chemical formula with a molecular weight that is the same from molecule to molecule, whereas a polymer has a defined chemical formula with a molecular weight that may vary from molecule to molecule. As used herein, "organic" includes metal complexes of hydrocarbyl and heteroatom-substituted hydrocarbyl ligands.

For additional background explanation and description of the state of the art for organic photosensitive devices, including their general construction, characteristics, materials, and features, U.S. Pat. No. 6,657,378 to Forrest et al., U.S. Pat. No. 6,580,027 to Forrest et al., and U.S. Pat. No. 6,352,777 to Bulovic et al. are incorporated herein by reference.

SUMMARY OF THE INVENTION

A method of fabricating a photosensitive optoelectronic device according to an embodiment of the present invention includes depositing a first organic semiconductor material on a first electrode to form a continuous, planar first layer. The first organic material is either a donor-type material or an acceptor-type material. If desired, the topography of the first layer may be changed by adding additional organic semiconductor material of the same type. After the first layer is formed a layer of a second organic semiconductor material is deposited on the first layer to form a discontinuous second layer, portions of the first layer remaining exposed. The second organic semiconductor material is a different type of material (donor or acceptor) than the first organic semiconductor material. The first organic semiconductor material may be deposited onto the second layer to form a discontinuous third layer, portions of at least the second layer remaining exposed. The depositing of the first and second organic semiconductor materials are alternated a number of times as desired. A final layer of the second organic material is deposited to form a continuous layer. A second electrode is deposited over the final layer, wherein at least one of the first electrode and the second electrode is transparent.

Figure 1:
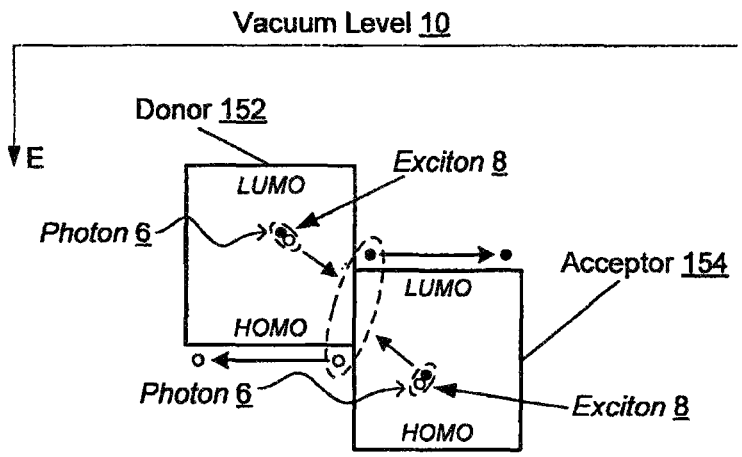
FIG. 1 is an energy level diagram illustrating a donor-acceptor heterojunction.

The figures are not necessarily drawn to scale.

DETAILED DESCRIPTION

The power conversion efficiency of organic photovoltaic (PV) cells has steadily increased since the introduction of the donor/acceptor (DA) heterojunction. Further improvements have been reported in entangled or "bulk-heterojunction" (BHJ) structures, where an exciton created by the absorption of a photon is always (ideally) within an exciton diffusion length (~10 nm) of a DA interface. However, the high series resistance of these BHJ amorphous organic blends limits the active layer thickness, leading to reduced light absorption, while exhibiting low fill factor and hence low solar energy conversion efficiency. One means to addressing the low mobility of charge carriers in disordered organic films is to deploy processing approaches that create order and crystallinity in the organic materials. In the past, the growth conditions and approaches to achieving crystallinity have simultaneously created excessive surface roughness, voids and pin-holes resulting in poor performance.

In this embodiment, a PV cell is provided in which the active layer is comprised of nanocrystalline organic regions forming high conductivity networks for charge extraction. This cell retains many of the benefits of crystalline organic combined with the high surface area of a bulk heterojunction without the disadvantages of previous approaches. Structural analysis confirms the existence of crystalline phases of the constituent donor molecule, copper phthalocyanine (CuPc), and the acceptor molecule, $C_{60}$. This new device architecture results in a three-fold increase of power conversion efficiency over that of a planar HJ solar cell control.

To reduce cell series resistance in the organic BHJ, it may be necessary to create interface morphological and crystalline order that leads to low resistance to charge carrier conduction, lacking bottlenecks or islands that impede carrier extraction. Indeed, spatial ordering induced by vertical phase separation leads to increased charge collection in organic/inorganic quantum dot hybrid cells from 1.7% for a disordered cell, to 2.8%. Organic solar cells may be provided with an ordered, interdigitated DA interface formed by crystalline donor protrusions and planarizing acceptor layer, grown by the process of organic vapor phase deposition (OVPD). Here, control of organic film crystallization and morphology resulted in a lower resistance, ordered, interdigitated interface that, when employed in solar cell structures, lead to significantly improved efficiency over otherwise identical, planar HJs. In a present embodiment, the DA crystalline interface concept is expanded into an extended bulk, highly interconnected and entangled interpenetrating network. Crystalline organic regions reduce overall series resistance versus comparable amorphous layers or domains enabling a thicker DA region favorable for photo absorption ($\eta_A$) that significantly increases the HJ interface area, favorable for exciton diffusion ($\eta_{ED}$) and crystallinity of the regions effectively conducts charges to the opposing electrodes of the cells, favorable for charge collection ($\eta_{CC}$) See U.S. Pat. No. 7,196,366.

Figure 2:
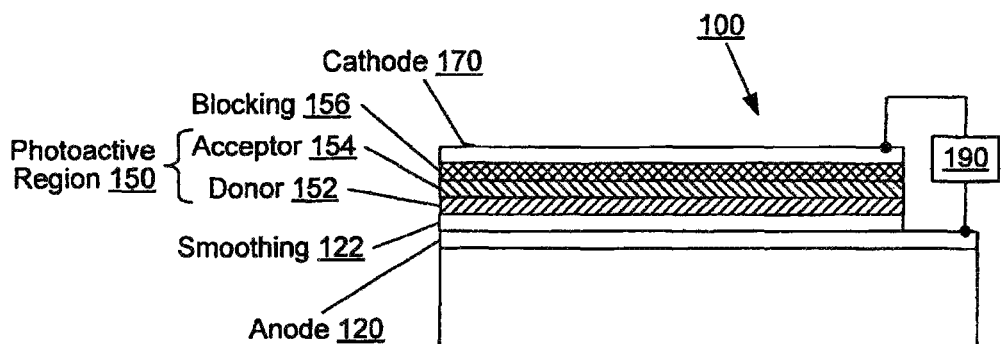
FIG. 2 illustrates an organic photosensitive device including a donor-acceptor heterojunction.

An organic photosensitive device comprises at least one photoactive region in which light is absorbed to form an exciton, which may subsequently dissociate into an electron and a hole. FIG. 2 shows an example of an organic photosensitive optoelectronic device 100 in which the photoactive region 150 comprises a donor-acceptor heterojunction. The "photoactive region" is a portion of a photosensitive device that absorbs electromagnetic radiation to generate excitons that may dissociate in order to generate an electrical current. Device 100 comprises an anode 120, an anode smoothing layer 122, a donor 152, an acceptor 154, an exciton blocking layer ("EBL") 156, and a cathode 170, over a substrate 110.

Examples of EBL 156 are described in U.S. Pat. No. 6,451,415 to Forrest et al., which is incorporated herein by reference for its disclosure related to EBLs. Additional background explanation of EBLs may also be found in Peumans et al., "Efficient photon harvesting at high optical intensities in ultrathin organic double-heterostructure photovoltaic diodes," *Applied Physics Letters* 76, 2650-52 (2000). EBLs reduce quenching by preventing excitons from migrating out of the donor and/or acceptor materials.

The terms "electrode" and "contact" are used interchangeably herein to refer to a layer that provides a medium for delivering photo-generated current to an external circuit or providing a bias current or voltage to the device. As illustrated in FIG. 2, anode 120 and cathode 170 are examples. Electrodes may be composed of metals or "metal substitutes." Herein the term "metal" is used to embrace both materials composed of an elementally pure metal, and also metal alloys which are materials composed of two or more elementally pure metals. The term "metal substitute" refers to a material that is not a metal within the normal definition, but which has the metal-like properties such as conductivity, such as doped wide-bandgap semiconductors, degenerate semiconductors, conducting oxides, and conductive polymers. Electrodes may comprise a single layer or multiple layers (a "compound" electrode), may be transparent, semi-transparent, or opaque. Examples of electrodes and electrode materials include those disclosed in U.S. Pat. No. 6,352,777 to Bulovic et al., and U.S. Pat. No. 6,420,031, to Parthasarathy, et al., each incorporated herein by reference for disclosure of these respective features. As used herein, a layer is said to be "transparent" if it transmits at least 50% of the ambient electromagnetic radiation in a relevant wavelength.

The substrate 110 may be any suitable substrate that provides desired structural properties. The substrate may be flexible or rigid, planar or non-planar. The substrate may be transparent, translucent or opaque. Rigid plastics and glass are examples of preferred rigid substrate materials. Flexible plastics and metal foils are examples of preferred flexible substrate materials.

An anode-smoothing layer 122 may be situated between the anode layer 120 and the donor layer 152. Anode-smoothing layers are described in U.S. Pat. No. 6,657,378 to Forrest et al., incorporated herein by reference for its disclosure related to this feature.

In FIG. 2, the photoactive region 150 comprises the donor material 152 and the acceptor material 154. Organic materials for use in the photoactive region may include organometallic compounds, including cyclometallated organometallic compounds. The term "organometallic" as used herein is as generally understood by one of ordinary skill in the art and as given, for example, in Chapter 13 of "Inorganic Chemistry" (2nd Edition) by Gary L. Miessler and Donald A. Tarr, Prentice Hall (1999).

Organic layers may be fabricated using vacuum deposition, spin coating, solution processing, organic vapor-phase deposition, inkjet printing, organic vapor jet printing and other methods known in the art.

Figure 3:
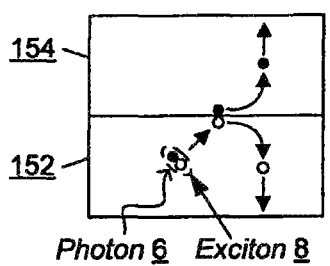
FIG. 3 illustrates a donor-acceptor bilayer forming a planar heterojunction.
Figure 4:
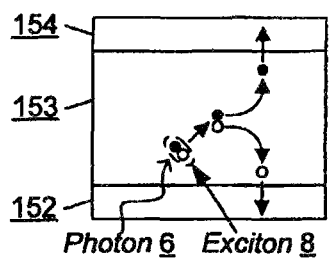
FIG. 4 illustrates a hybrid heterojunction including a mixed heterojunction between a donor layer and an acceptor layer.
Figure 5:
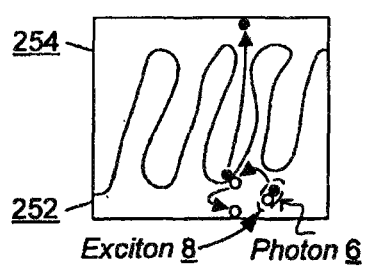
FIG. 5 illustrates a bulk heterojunction.

Examples of various types of donor-acceptor heterojunctions are shown in FIGS. 3-5. FIG. 3 illustrates a donor-acceptor bilayer forming a planar heterojunction. FIG. 4 illustrates a hybrid heterojunction including a mixed heterojunction 153 comprising a mixture of donor and acceptor materials. FIG. 5 illustrates an idealized "bulk" heterojunction. A bulk heterojunction, in the ideal photocurrent case, has a single continuous interface between the donor material 252 and the acceptor material 254, although multiple interfaces typically exist in actual devices. Mixed and bulk heterojunctions can have multiple donor-acceptor interfaces as a result of having plural domains of material. Domains that are surrounded by the opposite-type material (e.g., a domain of donor material surrounded by acceptor material) may be electrically isolated, such that these domains do not contribute to photocurrent. Other domains may be connected by percolation pathways (continuous photocurrent pathways), such that these other domains may contribute to photocurrent. The distinction between a mixed and a bulk heterojunction lies in degrees of phase separation between donor and acceptor materials. In a mixed heterojunction, there is very little or no phase separation (the domains are very small, e.g., less than a few nanometers), whereas in a bulk heterojunction, there is significant phase separation (e.g., forming domains with sizes of a few nanometers to 100 nm).

Small-molecule mixed heterojunctions may be formed, for example, by co-deposition of the donor and acceptor materials using vacuum deposition or vapor deposition. Small-molecule bulk heterojunctions may be formed, for example, by controlled growth, co-deposition with post-deposition annealing, or solution processing. Polymer mixed or bulk heterojunctions may be formed, for example, by solution processing of polymer blends of donor and acceptor materials.

If a photoactive region includes a mixed layer (153) or bulk layers (252, 254) and one or both of the donor (152) and acceptor layers (154), the photoactive region is said to include a "hybrid" heterojunction. The arrangement of layers in FIG. 4 is an example. For additional explanation of hybrid heterojunctions, Published U.S. Patent Application 2005/0224113 A1, entitled "High efficiency organic photovoltaic cells employing hybridized mixed-planar heterojunctions" by Jiangeng Xue et al., published Oct. 13, 2005, is hereby incorporated by reference.

In general, planar heterojunctions have good carrier conduction, but poor exciton dissociation; a mixed layer has good exciton dissociation but poor carrier conduction and collection; a bulk heterojunction has good exciton dissociation and good carrier conduction, but may experience charge build-up at the end of the material "cul-de-sacs," lowering collection and overall power efficiency. Unless otherwise stated, planar, mixed, bulk, and hybrid heterojunctions may be used interchangeably as donor-acceptor heterojunctions throughout the embodiments disclosed herein.

Figure 6:
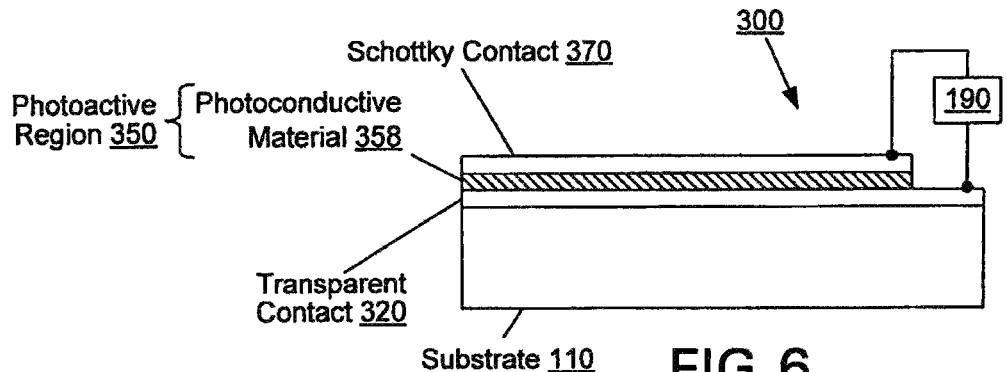
FIG. 6 illustrates an organic photosensitive device including a Schottky-barrier heterojunction.

FIG. 6 shows an example of a organic photosensitive optoelectronic device 300 in which the photoactive region 350 is part of a Schottky-barrier heterojunction. Device 300 comprises a transparent contact 320, a photoactive region 350 comprising an organic photoconductive material 358, and a Schottky contact 370. The Schottky contact 370 is typically formed as a metal layer. If the photoconductive layer 358 is an ETL, a high work function metal such as gold may be used, whereas if the photoconductive layer is an HTL, a low work function metal such as aluminum, magnesium, or indium may be used. In a Schottky-barrier cell, a built-in electric field associated with the Schottky barrier pulls the electron and hole in an exciton apart. Generally, this field-assisted exciton dissociation is not as efficient as the disassociation at a donor-acceptor interface.

The devices as illustrated may be connected to an element 190. If the device is a photovoltaic device, element 190 is a resistive load which consumes or stores power. If the device is a photodetector, element 190 is a current detecting circuit which measures the current generated when the photodetector is exposed to light, and which may apply a bias to the device (as described for example in Published U.S. Patent Application 2005-0110007 A1, published May 26, 2005 to Forrest et al.). If the rectifying junction is eliminated from the device (e.g., using a single photoconductive material as the photoactive region), the resulting structures may be used as a photoconductor cell, in which case the element 190 is a signal detection circuit to monitor changes in resistance across the device due to the absorption of light. Unless otherwise stated, each of these arrangements and modifications may be used for the devices in each of the drawings and embodiments disclosed herein.

An organic photosensitive optoelectronic device may also comprise transparent charge transfer layers, electrodes, or charge recombination zones. A charge transfer layer may be organic or inorganic, and may or may not be photoconductively active. A charge transfer layer is similar to an electrode, but does not have an electrical connection external to the device and only delivers charge carriers from one subsection of an optoelectronic device to the adjacent subsection. A charge recombination zone is similar to a charge transfer layer, but allows for the recombination of electrons and holes between adjacent subsections of an optoelectronic device. A charge recombination zone may include semitransparent metal or metal substitute recombination centers comprising nanoclusters, nanoparticles, and/or nanorods, as described for example in U.S. Pat. No. 6,657,378 to Forrest et al.; Published U.S. Patent Application 2006-0032529 A1, entitled "Organic Photosensitive Devices" by Rand et al., published Feb. 16, 2006; and Published U.S. Patent Application 2006-0027802 A1, entitled "Stacked Organic Photosensitive Devices" by Forrest et al., published Feb. 9, 2006; each incorporated herein by reference for its disclosure of recombination zone materials and structures. A charge recombination zone may or may not include a transparent matrix layer in which the recombination centers are embedded. A charge transfer layer, electrode, or charge recombination zone may serve as a cathode and/or an anode of subsections of the optoelectronic device. An electrode or charge transfer layer may serve as a Schottky contact.

Figure 7:
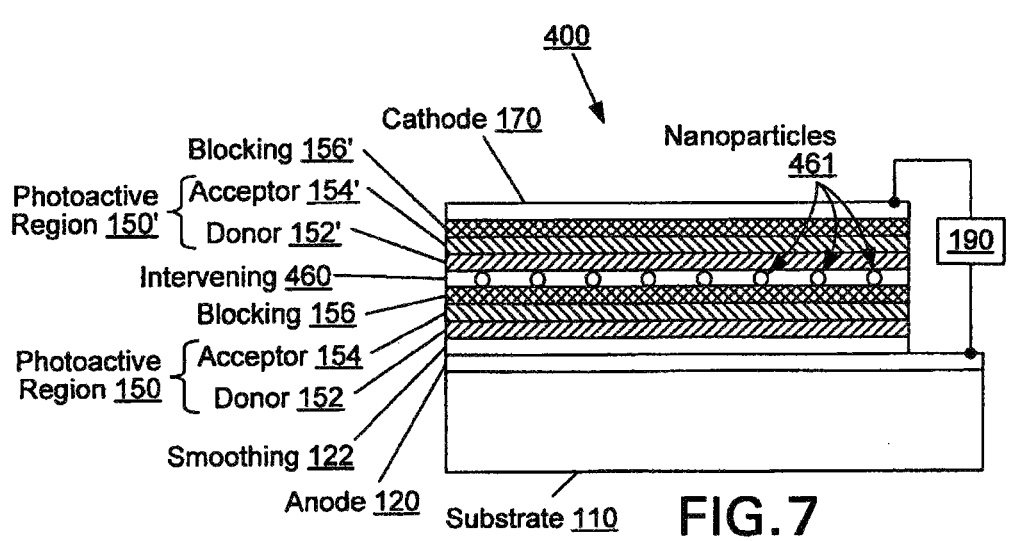
FIG. 7 illustrates tandem photosensitive cells in series.
Figure 8:
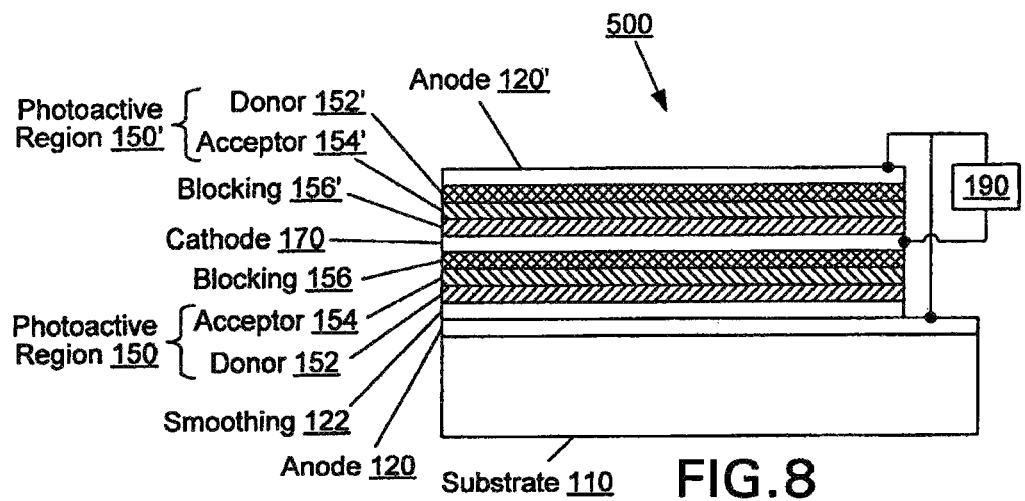
FIG. 8 illustrates tandem photosensitive cells in parallel.

FIGS. 7 and 8 illustrate examples of tandem devices including such transparent charge transfer layers, electrodes, and charge recombination zones. In device 400 in FIG. 7, photoactive regions 150 and 150' are stacked electrically in series with an intervening conductive region 460. As illustrated without external electrical connections, intervening conductive region 460 may be a charge recombination zone or may be a charge transfer layer. As a recombination zone, region 460 comprises recombination centers 461 with or without a transparent matrix layer. If there is no matrix layer, the arrangement of material forming the zone may not be continuous across the region 460. Device 500 in FIG. 8 illustrates photoactive regions 150 and 150' stacked electrically in parallel, with the top cell being in an inverted configuration (i.e., cathode-down). In each of FIGS. 7 and 8, the photoactive regions 150 and 150' and blocking layers 156 and 156' may be formed out of the same respective materials, or different materials, depending upon the application. Likewise, photoactive regions 150 and 150' may be a same type (i.e., planar, mixed, bulk, hybrid) of heterojunction, or may be of different types.

In each of the devices described above, layers may be omitted, such as the smoothing layer and the exciton blocking layers. Other layers may be added, such as reflective layers or additional photoactive regions. The order of layers may be altered or inverted. A concentrator or trapping configuration may be employed to increase efficiency, as disclosed, for example in U.S. Pat. No. 6,333,458 to Forrest et al. and U.S. Pat. No. 6,440,769 to Peumans et al., which are incorporated herein by reference. Coatings may be used to focus optical energy into desired regions of a device, as disclosed, for example in Published US Patent Application No. 2005-0266218 A1, entitled "Aperiodic dielectric multilayer stack" by Peumans et al., U.S. Pat. No. 7,196,835, which is incorporated herein by reference. In the tandem devices, transparent insulative layers may be formed between cells, with the electrical connection between the cells being provided via electrodes. Also in the tandem devices, one or more of the photoactive regions may be a Schottky-barrier heterojunction instead of a donor-acceptor heterojunction. Arrangements other than those specifically described may be used.

Efforts have focused on the use of organic photovoltaic cells to achieve acceptable photovoltaic conversion efficiencies with economical production costs. Efficient dissociation of excitons in organic materials occurs under strong electric fields, or at a donor-acceptor heterojunction where the differences in the electron affinities and ionization potentials between the contacting organic materials are sufficiently large to overcome the exciton binding energy. The latter mechanism has been employed to form donor-acceptor heterojunction photovoltaic cells with a power conversion efficiency $\eta_P$~1%, and is limited by exciton diffusion lengths ($L_D$~10-40 nm) being much shorter than the optical absorption length ($L_A$~100 nm). The organic materials used for solar cells usually absorb more than 90% of the incident light with a thickness of 100 nm.

Excitons generated within an exciton diffusion length of a donor-acceptor heterojunction have a high probability of disassociating efficiently at the heterojunction. Conversely, excitons generated more than an exciton diffusion length from the donor-acceptor heterojunction generally are unlikely to disassociate efficiently and to contribute to photocurrent.

As described above with FIG. 5, bulk heterojunctions were developed in an effort to maximize the proximity a donor-acceptor heterojunction to an exciton. Bulk heterojunctions preferably have a highly interfolded or interpercolated network of donor and acceptor materials such that an exciton generated by the absorption of incident radiation is always close to a heterojunction, and therefore, is likely to contribute to photocurrent.

Early bulk heterojunctions were fabricated by spin coating a mixture of soluble versions of the donor and acceptor materials, followed by phase separation of the mixture by high temperature annealing. During the spin coating and solvent evaporation, the donor and acceptor materials phase separate, creating an intricate inter-penetrating network with a large interfacial area between the two phases. The morphology of the resulting structure was controlled by changing the spin conditions, solvents, and relative material concentrations. Although bulk heterojunctions formed by spin-coat methods exhibited improved power conversion efficiencies over traditional bilayer designs, the bulk devices exhibited a high series resistance due to the disordered structure of the interface layer. Phase separation during spin coating and annealing-induced phase separation are both thermodynamically driven methods characterized by randomly structured inter-digitation between the donor and acceptor layers due to the entropy of the interface formation process.

The performance of bulk devices was improved by switching from spin coating to organic vapor phase deposition (OVPD), as described in U.S. Patent Application Publication 2005/0227390 A1 to Shtein et al. entitled "Method of Fabricating An Optoelectronic Device Having A Bulk Heterojunction", and in "Controlled growth of a molecular bulk heterojunction photovoltaic cell" by Yang et al., Nature Materials Vol. 4, 37-41 (2005), both of which are incorporated herein by reference.

OVPD is inherently different from the widely used vacuum thermal evaporation (VTE) in that OVPD uses a carrier gas to transport vapors into a deposition chamber. Spatially separating the functions of evaporation and transport leads to precise control over the deposition process, and enabling control over the organic surface morphology, e.g., flat with smooth surface or layers with protrusions. Another feature of OVPD, compared with VTE, is the large molecular surface diffusivity and the non-ballistic trajectories followed by the molecules in their arrival at the surface. OVPD is particularly effective at filling preexisting voids and other surface non-uniformities, whereas VTE is ineffective due to the long mean free paths and ballistic trajectories followed by incident molecules.

At typical deposition conditions used in OVPD, the flow of the carrier gas around the substrate creates a hydrodynamic boundary layer where molecular transport is diffusion-limited. The deposition rate, deposition efficiency, and film morphology are controlled by adjusting the organic species concentration, flow hydrodynamics, and surface diffusivity. Utilizing OVPD, ordered-bulk heterojunctions grown using small molecule materials have exhibited improved series resistance over earlier spin-coated bulk heterojunction designs.

In addition to improvements in carrier mobility, series resistance, and overall efficiency over spin-coat designs, the ordered nature of OVPD-grown bulk heterojunctions can eliminate the occurrence of pockets of donor and acceptor material not electrically connected by a percolation pathway to an electrode.

However, the absorption efficiency of OVPD-grown bulk heterojunctions is spatially limited. In general, the absorption characteristics of a heterojunction are maximized by selecting donor materials and acceptor materials with different absorption spectra. If an incident photon has a wavelength near an absorption peak of the first material but not the second material, and the incident photon transits through the bulk heterojunction predominantly via the second material (e.g., passing down the length of a "finger" of the second material), there is a reduced likelihood that the photon will contribute to photocurrent.

It would be beneficial to retain the advantages of an ordered bulk heterojunction, such as the short distances for excitons to travel before disassociation, while further increasing photon-to-exciton conversion by increasing the donor-acceptor interface area where excitons disassociate and overall layer thickness.

The nanocrystalline network relies on the growth of ultra-thin, alternating layers of the donor and acceptor molecules such that any given layer does not fully cover the layer that lies below. Incomplete coverage results from a combination of lack of surface wetting, and control of film morphology and crystalline texture using OVPD (as described below).

Figure 9A:
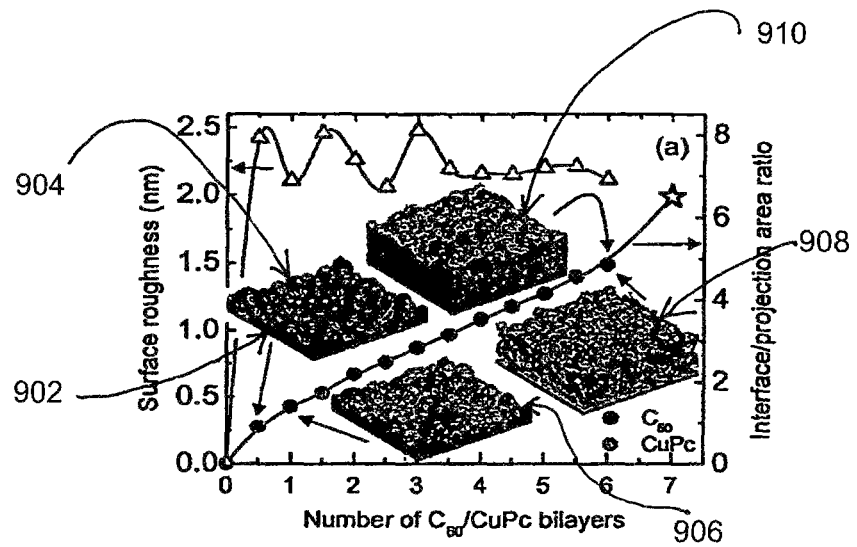
FIGS. 9a-9b illustrate simulation of the growth progression of $[C_{60}(3\ nm)/CuPc(3\ nm)]_6$ nanocrystalline network with a plot depicting the root mean square (rms) surface roughness and the interface area relative to a planar donor/acceptor junction; and mass flow rates and pressure change recorded during organic vapor phase deposition of the $C_{60}$/CuPc structure with a barrel valve in the off position, preventing organics from diffusing out of the barrel and in the on position so that carrier gas can convey organic molecules out of the barrel.

The growth of nanocrystalline donor/acceptor (or "DA") networks was simulated, with results shown in FIG. 9A (as described below). The simulations assume that growth of the network begins on a continuous and planar donor layer 904 of copper phthalocyanine (CuPc) predeposited on a transparent conductive substrate 902, e.g., indium-tin-oxide (ITO). It is noted that a planar layer may have a certain amount of roughness to it. Alternatively, after a donor layer of CuPc is created, additional donor material may be added to this layer to change its topography. Though in this embodiment, a donor layer is first created, an acceptor layer may be created first. After the donor material, a very thin layer 906 of the acceptor, $C_{60}$ is added, which forms crystalline islands due to incomplete surface wetting, leaving a portion of the underlying CuPc layer exposed. A second, thin crystalline CuPc layer 908 is deposited, partially covering the $C_{60}$ layer with portions of the second CuPc layer directly contacting the first, continuous CuPc layer. The diffusive flow in OVPD preferably drives CuPc molecules into the valleys between neighboring $C_{60}$ crystallites to minimize total film surface energy. By continuously alternating the deposition of $C_{60}$ and CuPc, 3D interpenetrating nanocrystalline networks of $C_{60}$ and CuPc are formed. The growth simulation shows a monotonic increase of the interface area as the number of alternating Donor/Acceptor bilayers is increased, As shown in FIG. 9A, the final interface area is six times that of a planar interface. The root mean square (rms) surface roughness of all nanocrystiline films varies between 2.0 and 2.5 nm, and reaches a maximum of approximately 2.2 nm. The final step is the growth of a continuous $C_{60}$ layer 910 on top of the network, planarizing the film surface to prevent shorts, As mentioned above, if the first layer is an acceptor layer, then this final layer would be a donor layer instead.

Figure 9B:
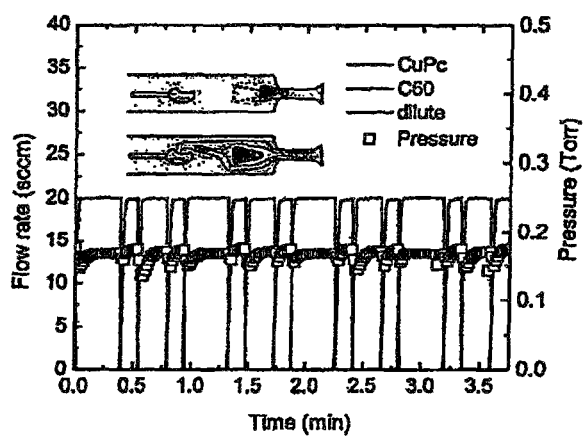
Figure 10A:
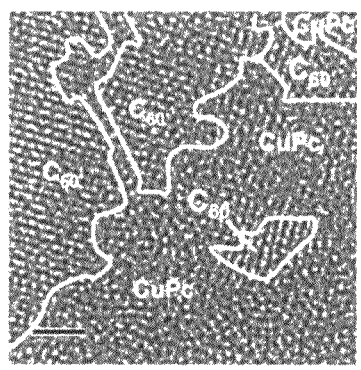
FIGS. 10a-10c illustrate structural characterization of a $C_{60}$/CuPc nanocrystalline film grown on an indium-tin-oxide (ITO) substrate.
Figure 10B:
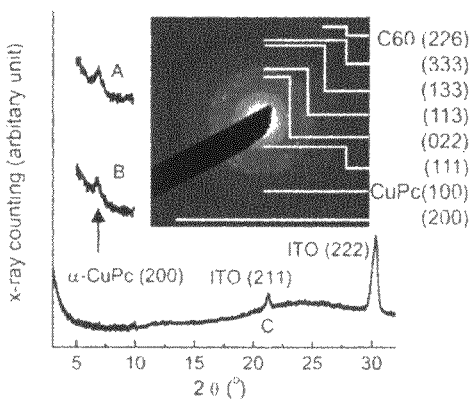

The crystalline film texture of an OVPD-grown multilayer (grown by the process illustrated in FIG. 9b, and described below) is confirmed by transmission electron microscopy (TEM), x-ray diffraction (XRD) and atomic force microscopy (AFM), as shown in FIG. 10. A cross-sectional TEM image of $[C_{60}(6.1\ nm)/CuPc(6.1\ nm)]_{10}$ is shown in FIG. 10a. (Here, the notation $[A(x\ nm)/D(y\ nm)]_n$ refers to the thicknesses x, y of the Acceptor and Donor layers, respectively, and n is the number of DA pairs.) Though a number of "pairs" of acceptor/donor layers are described herein, it is possible to alternate layers such that there is an extra donor or acceptor layer. The $C_{60}$ and CuPc phases are similar to those observed in a crystalline bilayer film. The $C_{60}$ phase has clearly ordered, close packed molecular planes, while the monoclinic CuPc lattice appears less ordered since the image is not taken along the projection of a single, crystallographic plane. Both electron and x-ray diffraction confirm the existence of crystalline domains of $C_{60}$ and CuPc. Crystalline domain sizes range from 5 nm to 10 nm, similar to those found in homogeneous films of $C_{60}$, but smaller than ZnPc crystals obtained by thermal evaporation. Similar TEM images of $[C_{60}(3.1\ nm)/CuPc\ (3.1\ nm)]_{17}$ have been obtained where the crystallites are similar in shape but have slightly smaller sizes, as expected. High-angle annular dark-field images confirm the presence of CuPc aggregates, with sizes comparable to the domain sizes observed in FIG. 10a.

Figure 10C:
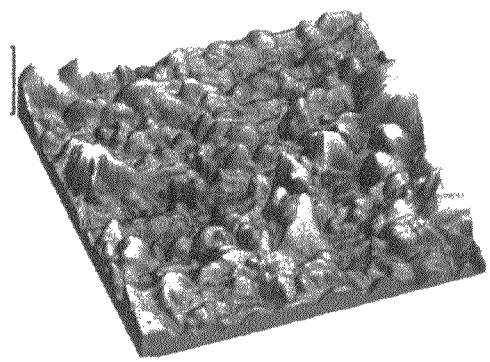

A selected area electron diffraction image of the same $[C_{60}(6.1\ nm)/CuPc(6.1\ nm)]_{10}$ film in plan-view (FIG. 10b, inset) shows diffraction spots corresponding to ordered domains of α-CuPc and face centered cubic (fcc) $C_{60}$. The crystallites have a similar size and distribution as those seen in cross-sectional view. The well defined diffraction spots indicate a high degree of crystalline order and orientation within the region of the probe beam. In addition, the XRD patterns of $[C_{60}(3.5\ nm)/CuPc(3.5\ nm)]_5$ and $[C_{60}(1.9\ nm)/CuPc(1.9\ nm)]_{10}$ shown in FIG. 10b, confirm the existence of α-CuPc in the two samples. No $C_{60}$ diffraction peaks can be identified in the scanning range due to its large lattice constant (a=14.16 Å). These structural studies show that crystalline phases are obtained by alternating the growth of the Donor and Acceptor materials using OVPD, as opposed to amorphous CuPc:$C_{60}$ mixed films grown by co-evaporation (bottom scan, FIG. 10b), where the crystalline phase separation is limited. As shown in FIG. 10c, the surface morphology of the same $[C_{60}(6.1\ nm)/CuPc(6.1\ nm)]_{10}$ film observed by AFM shows the crystalline texture with a root-mean-square (rms) roughness of 12.7 nm, reflecting the roughening effect (c.f. FIG. 9a) caused by the crystallite growth over the ITO substrate whose rms roughness <3 nm.

Figure 11A:
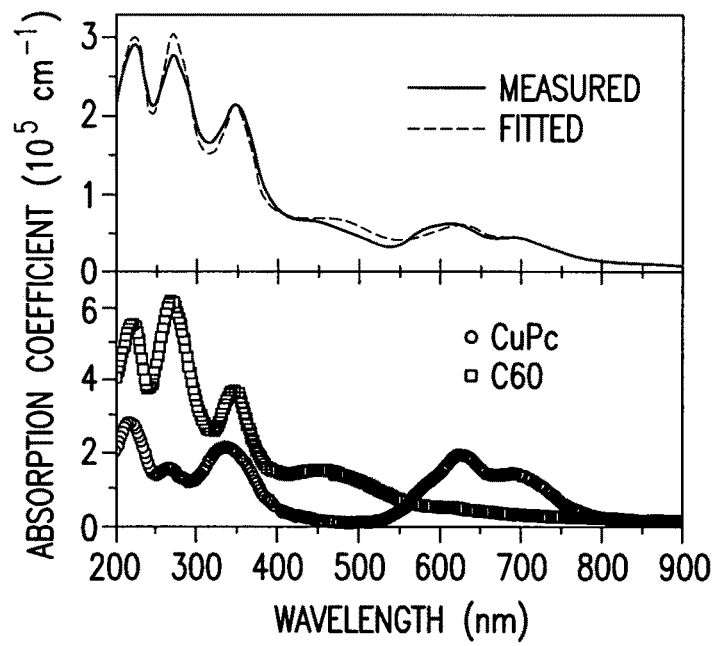
FIGS. 11a-11b demonstrate absorption of a nanocrystalline $[C_{60}(3.1\ nm)/CuPc(3.1\ nm)]_{17}$ film, and a fit by $\alpha_{NC}=0.48\alpha_{C_{60}}+0.23\alpha_{CuPc}$ and the normalized absorption spectra in the low-energy Q-band of CuPc.
Figure 11B:
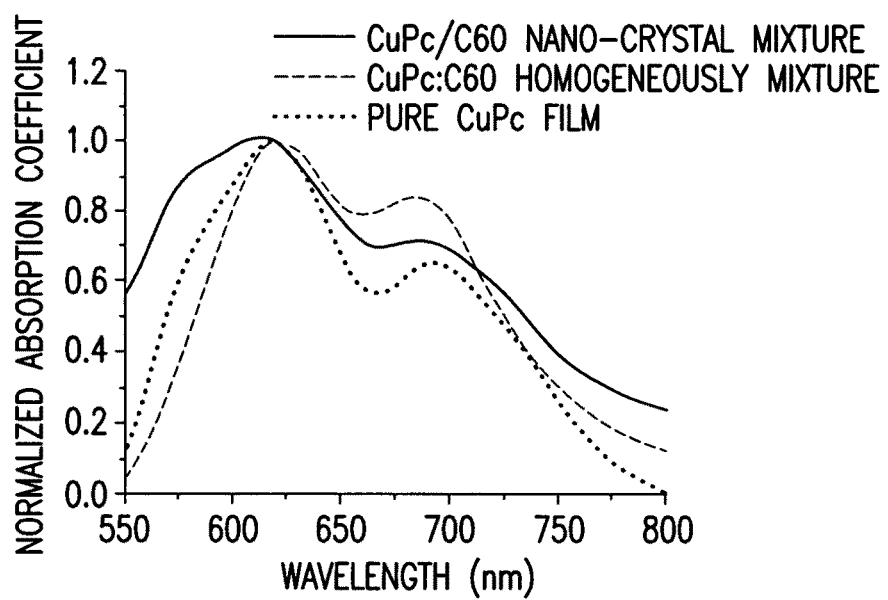

The absorption spectra of the nanocrystalline films are fit to the linear sum of the neat CuPc and $C_{60}$ absorption spectra ($α_{CuPc}$ and $α_{C60}$, respectively). FIG. 11a shows the absorption coefficient of $[C_{60}(3.1\ nm)/CuPc(3.1\ nm)]_{17}$ grown on a fused quartz substrate, fit using $α_{NC}=0.48α_{C60}+0.23α_{CuPc}$. Films with different donor/acceptor cycle thicknesses are fit using similar expressions. Pure CuPc films have two peaks centered at wavelengths of λ=620 and 695 nm, corresponding to dimer and monomer absorption, respectively. For amorphous CuPc:$C_{60}$ mixtures, the absorption at λ=695 nm is enhanced due to an increased intermolecular distance. By comparison, the nanocrystalline layer peak at λ=695 nm is less pronounced than in the mixed film, implying the presence of a high density of CuPc crystallites (FIG. 11b). The asymmetry in the $C_{60}$ and CuPc absorption obtained in these fits may be an effect of differing crystal sizes for these two molecular constituents.

These crystalline structures are in a stable, rather than metastable structure, as observed in annealed mixtures of CuPc and 3, 4, 9, 10-perylenetetracarboxylic bis-benzimidazole (PTCBI). Furthermore, compared to phase-separated polymer cells prepared by annealing at 110-150° C., the small molecular weight films in these cells have high glass transition temperatures (>400° C.). Further phase separation of these cells is, therefore, not expected to occur under normal operating conditions and required operational lifetimes of such devices.

A series of CuPc(14.5±0.2 nm)/$[C_{60}(3.2±0.2\ nm)/CuPc(3.2±0.2\ nm)]_n$/$C_{60}$(50.0±0.5 nm)/BCP(10 nm)/Ag (BCP=bathocuproine) double heterojunction PV cells were fabricated, where n ranged from 0 to 12. Here, BCP was used as an exciton blocking layer. The nominal thicknesses of the $C_{60}$(3.2 nm)/CuPc(3.2 nm) multilayers were varied between 6.4 and 76.8 nm, keeping $C_{60}$:CuPc=1 for all samples. Hence, for n=12, the total organic active film thickness was t=141 nm, which exceeds t=100 nm, typical of that of a conventional, bilayer small molecular weight cell. This, in turn, increases the optical absorption due to its exponential dependence on thickness (i.e., cell responsivity follows (1−exp[−αt])), where α is the absorption coefficient of the organic material. Furthermore, the top $C_{60}$ layer is thicker than used in the optimized bilayer device, as necessary to planarize the rough film surface (c.f. FIG. 9c).

Figure 12A:
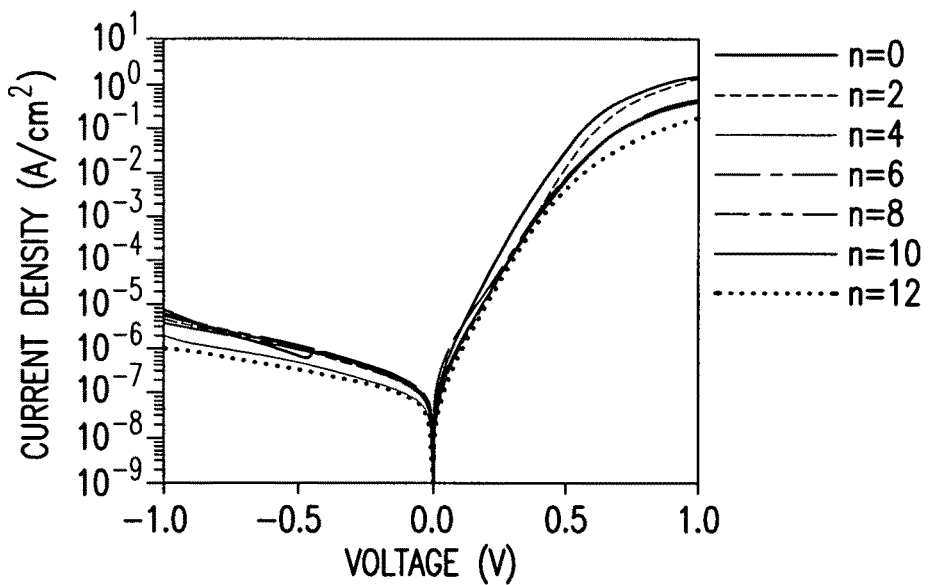
FIGS. 12a-12b demonstrate the performance of CuPc $(14.5\pm0.2\ nm)/[C_{60}(3.2\pm0.2\ nm)/CuPc(3.20\pm0.2\ nm)]_n/C_{60}$ $(50.0\pm0.5\ nm)/BCP\ (10\ nm)/Ag$ solar cells, with n varying from 0 to 12, and the total thickness of the active layers varying from 54.5 to 141 nm.

The dark current density-voltage (J-V) characteristics of all cells have rectification ratios >$10^5$ at ±1 V, as shown in FIG. 12a, while the forward current density at 1V drops by a factor of 10, from n=0 to n=12. Fitting the forward J-V curves using the ideal diode equation yields the specific series resistance, $R_{SA}$, as a function of the number of alternating donor/acceptor pairs (and hence total active layer thickness) in FIG. 12b. The bilayer (n=0) cell has $R_{SA}$=0.25 Ω·cm², increasing to 1.7 Ω·cm² for n=12. That $R_{SA}$ increases by a factor of approximately 7 for a cell only twice as thick indicates that the nanocrystalline region is not completely free of bottlenecks to charge conduction. However, multilayers with fewer periods show only a 2 to 3 times increase in $R_{SA}$, suggesting that disorder increases significantly only for the deepest stacks.

Figure 12B:
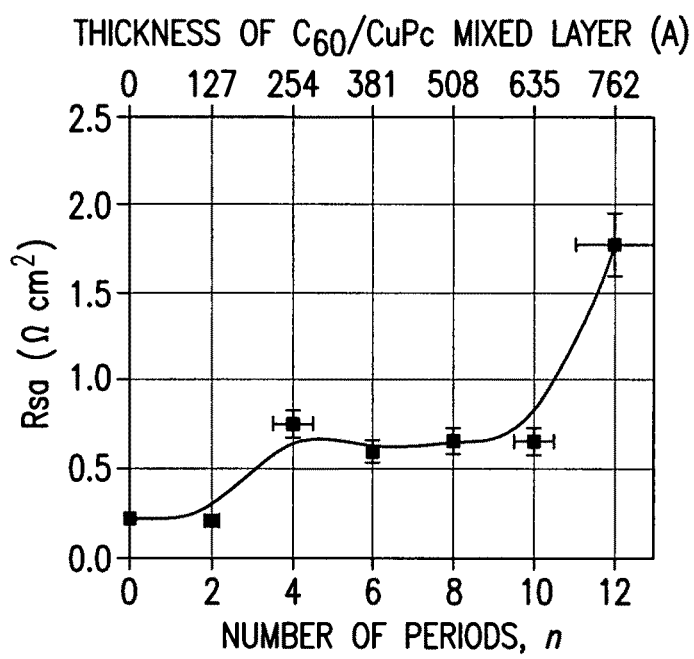
Figure 13A:
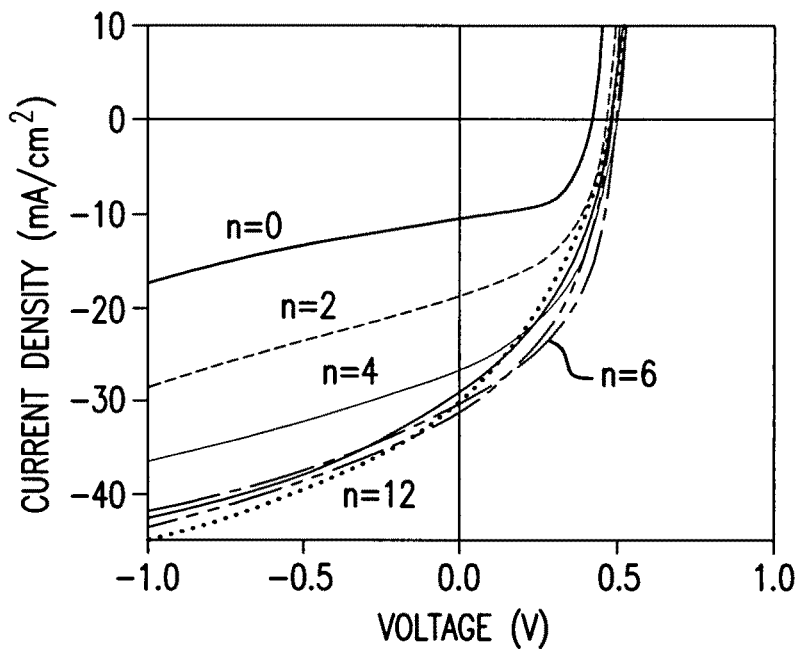
FIGS. 13a-13d depict parameters affecting room-temperature power-conversion efficiency of the solar cells of FIGS. 12a-12b.
Figure 13B:
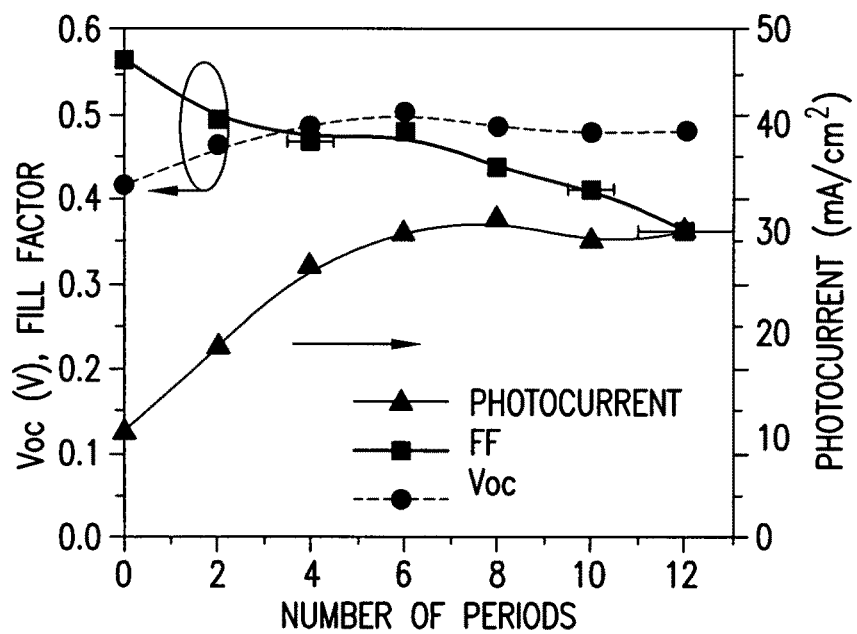

The photo-response of the same cells as in FIG. 12 measured under 100±4 mW/cm² AM 1.5 G solar irradiation (after spectral correction, see below) are shown in FIG. 13a. The short circuit current (Jsc), open circuit voltage (Voc) and fill factor (FF) are plotted in FIG. 13b. With n increasing from 2 to 6, Jsc significantly increases by nearly a factor of 3, from 10.3±0.3 mA/cm² in the bilayer cell to 31.3±0.3 mA/cm², and then saturates as n is increased further, due to the high series resistance of the thickest cells with large and entangled crystalline networks. In the same figure, Voc shows a similar trend, starting from 0.42±0.01 V in the bilayer cell (n=0), and then increasing to a saturation value of 0.50±0.01 V at n>6. Finally, FF decreases from 0.56±0.01 at n=0 to 0.48 at n=6, and drops to 0.36±0.01 at n=12, once more reflecting the increase of resistance in the deepest stacks, as shown in FIG. 12b.

Figure 13C:
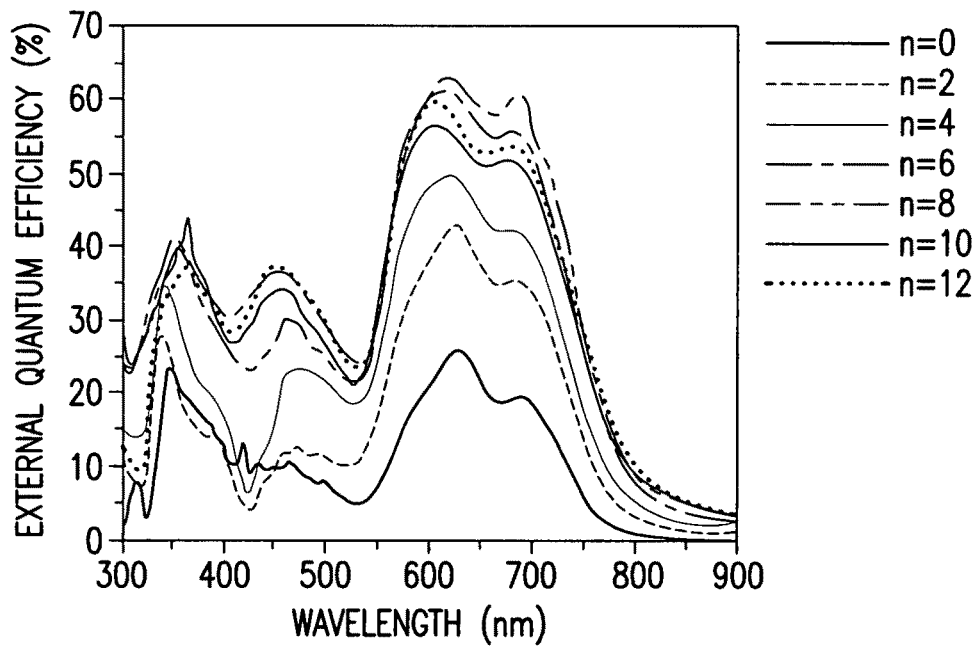

The external quantum efficiency (EQE) as a function of wavelength is shown in FIG. 13c. The EQE peak, centered between λ=450 and 470 nm, results from $C_{60}$ absorption whereas the peaks at λ=620 and 695 nm are due to CuPc absorption (c.f. FIG. 11a). As the number of $C_{60}$/CuPc pairs increases from n=0 to n=6, the EQE increases rapidly, i.e., the λ=620 nm peak increases from 25% to 61%, and the peak at λ=450 nm increases from 10% to 36%, both showing a >2.5-fold increase with n. The EQE decreases at larger n due to a lower carrier collection efficiency resulting from increased resistance, possibly indicating that the percolating conducting paths formed by the network of nanocrystallites are interrupted by bottlenecks or islands. The broad peak corresponding to $C_{60}$ absorption shifts to shorter wavelength as n increases, as a result of the optical field changes with the thickness. The EQE spectra measured in the dark were the same as those tested under 100 mW/cm² white-light flooded illumination, suggesting minimal charge carrier recombination at high photogenerated carrier concentrations. In contrast, the photoresponsivity decreases with light intensity in organic BHJ solar cells obtained by annealing, and in polymer-inorganic hybrid cells with less ordered conductive pathways.

Growth of an organized interdigitated donor/acceptor interface results in a 2.7 times increase in efficiency in a CuPc/PTCBI solar cell over its planar analog, but that architecture showed no improvement when the CuPc/$C_{60}$ system was used. This lack of improvement was attributed to the long (approximately 40 nm) exciton diffusion length in $C_{60}$, which exceeded the interdigitated feature width. The CuPc/PTCBI cell characteristic diffusion lengths were <10 nm, or half of the feature size, hence leading to the efficiency improvement observed. In contrast, the photoresponse of CuPc and $C_{60}$ in the nanocrystalline cells both increase by more than 2.5 times, suggesting that the high carrier mobility in the extended, percolating networks is primarily responsible for their improvement in efficiency.

Figure 13D:
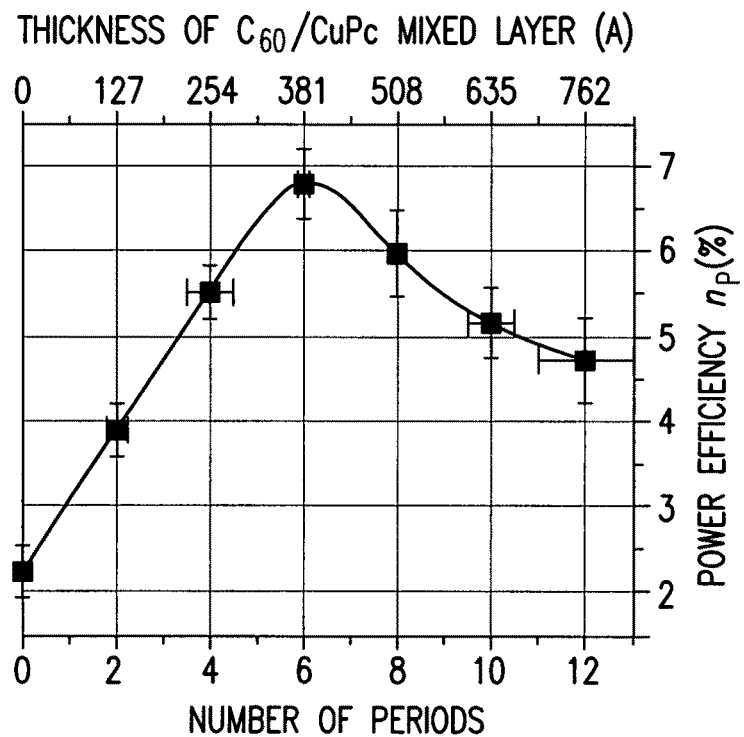

The power conversion efficiency, $\eta_P$, is plotted as a function of n in FIG. 13d. Here, $\eta_P$=2.3±0.3% in the bilayer device (n=0) increases by a factor of 3, to a maximum of 6.9±0.4% at n=6, corresponding to a total thickness of the nanocrystalline region of 38 nm, which is almost double the optimum thickness of a mixed CuPc:$C_{60}$ solar cell active region. The efficiency rolls off to 4.7±0.4% at n=12. The power efficiency of the unoptimized CuPc/$C_{60}$ bilayer control cell is consistent with that reported by other groups, although it is not as high as the best reported for planar cells using the same materials system grown by vacuum thermal evaporation. The photocurrent and power efficiencies of unpackaged devices measured in air referenced to a National Renewable Energy Laboratory (NREL) calibrated Si cell were corrected to 1 sun AM 1.5 G solar irradiation using standard spectral mismatch factors. Overlap integration of the EQE and AM 1.5 G spectrum yields a smaller photocurrent than those measured, likely due to degradation of unencapsulated devices, as previously observed.

The embodiments above introduce an organic solar cell architecture incorporating an all-organic nanocrystalline network which has both a large donor/acceptor HJ interface area favorable for exciton dissociation, and a greater thickness for light absorption. The crystalline order reduces the increase in series resistance in these devices as compared with a similar thickness amorphous layer. The thicker crystalline layer thus introduces a smaller increase in series resistance with increasing thickness, and may result in a three-fold increase of efficiency over planar HJ controls in a one-to-one comparison. The solar cell active region thicknesses are >100 nm, eliminating shorts commonly observed in thinner cells, while also increasing the active region thickness, leading to an exponential increase in light absorption. While these cells were grown by OVPD, such donor/acceptor networks should also be achievable by vacuum thermal evaporation or organic molecule beam deposition. Furthermore, changing the nanocrystalline size, varying the donor/acceptor ratio, incorporating more than two molecular components to obtain broader coverage of the solar spectrum, and employing multiple cells in a tandem structure may lead to even higher efficiencies. See, U.S. patent application Ser. No. 10/911,560 filed on Aug. 5, 2004, the disclosure of which is incorporated by reference in its entirety. The embodiment above demonstrate that control of the fully organic nanostructure morphology leads to highly interconnected nanocrystalline networks that significantly improve both exciton dissociation and charge collection that have potential application to a new generation of solar energy conversion devices.

With simulation, a [$C_{60}$(3 nm)/CuPc(3 nm)]$_6$ structure is grown on a predeposited, flat CuPc layer, assuming a 80×80 nm lattice with periodic boundary conditions. When simulating the first discontinuous layer, the $C_{60}$ crystals randomly nucleate on the underlying flat CuPc layer at a density of 2.2 crystals/100 nm². The hemispherical $C_{60}$ crystals follow a normal distribution with an average radius of 4 nm, and a standard deviation of 2 mm, matching the crystal sizes observed (see FIG. 10). The second discontinuous CuPc layer is deposited on the first, discontinuous $C_{60}$ layer, where the nucleation probability P of a certain lattice site (x, y) is inversely proportional to its height $h_{x,y}$:P exp($h_o-h_{x,y}$). Here $h_O$ is the height of the thinnest point of the underlying film. This simulates the planarizing effect in OVPD that minimizes total film surface energy. Additional $C_{60}$/CuPc layers are simulated using an identical procedure until reaching the desired total number of layers. The simulation is an approximation based on the vapor phase deposition procedure, while the simulation parameters, i.e., crystal dimension and density are taken from those observed by TEM and XRD. The shapes of deposited crystals are simulated as hemispheres assuming that the materials attempt to minimize surface energy. The simulated 3D network generates a structure similar to the presumed experimental structure, although a more precise simulation of the nanocrystals would involve dynamic considerations, such as deposition conditions and crystallization rate.

The organic source materials: CuPc, $C_{60}$ and BCP were purified by gradient sublimation prior to use. The films were deposited on 300 nm-thick ITO coated glass substrate (Nippon Sheet Glass Ca), pre-cleaned with organic solvents and exposed to ultraviolet/ozone before loading into the OVPD chamber with a base pressure <0.09 Torr. OVPD employed a continuous flow of purified $N_2$ through the organic source barrels regulated with mass flow controllers and a throttle valve. The substrate temperature $T_{Sub}$ was kept constant at 15±0.5° C. for all growth. The conditions for the growth of the first CuPc continuous layer were: source temperature, $T_{CuPc}$=446±1° C., $N_2$ flow rate=150 sccm (standard cubic centimeters per minute); reactor pressure P=–0.587±0.001 Torr; and growth time $t_g$=2.5 min. The conditions for the last $C_{60}$ planarizing layer were: $T_{C60}$=471±2° C., $N_2$ flow rate=100 sccm, P=0.421±0.001 Torr, and $t_g$=7.9 min. For the discontinuous CuPc and $C_{60}$ nano-crystallite growth the source temperatures were: $T_{CuPc}$=420±1° C., $T_{C60}$=463±2° C., respectively. The thickness of each layer grown by OVPD is limited by quickly switching the carrier gas flow on and off through the two molecular source barrels (FIG. 9b inset). Constant $N_2$ flow at 20 sccm through the CuPc or $C_{60}$ molecular source barrels was used during deposition, with the same $N_2$ flow used for 9 s between the switching of $C_{60}$ and CuPc to minimize material mixing of the donor and acceptor molecules in the chamber prior to deposition. The constant flow results in a stable pressure of 0.166±0.007 Torr during the growth (see FIG. 9b). In each $C_{60}$/CuPc cycle, $C_{60}$ was deposited at a rate of 0.14±0.01 nm/s and CuPc was deposited at a rate of 0.25±0.01 nm/s, calibrated from previous growth runs where the product film thicknesses were measured using ellipsometry. Cone-shape stoppers were used at the barrel nozzle exit ports to prevent organics from diffusing into the chamber when the source flow is off. After CuPc/$C_{60}$ growth, the samples were transferred through a $N_2$ glove-box into a vacuum chamber where a 10 nm thick BCP layer, and the 100 nm thick Ag cathode were deposited using thermal evaporation at a pressure less than $4\times10^{-7}$ Torr through a shadow mask with an array of 1 mm diameter circular openings.

For the cross-sectional TEM, a 100-nm thick Au layer was deposited on top of the organic films to protect the organic during the thinning process. Two such pieces were glued together face-to-face. The sample was then ground, polished and thinned to less than 100 nm by ion milling. A 200 kV JEOL JEM2010F STEM/TEM was used for high-resolution electron microscopy and high-angle annular dark-field imaging. Selected area electron diffraction (SEAD) was used for plan-view organic films pealed off from the substrates. The SEAD diffraction was calibrated to Au sample and the calculated lattice constants matches literature values with errors <5% for α-CuPc and <2.5% for $C_{60}$. The absorption spectra were measured using a Perkin-Elmer Lambda 800 UV/vis spectrometer for samples grown on fused quartz substrates.

Solar cell performance was tested in ambient conditions in air without encapsulation. To measure the EQE, a monochromatic beam of light from a Xe-lamp was chopped at 400 Hz and focused to a spot on the 1-mm diameter device. The light intensity was measured using an NREL-standard calibrated Si photodetector, and photocurrent spectra were measured using a lock-in amplifier referenced to the chopper frequency. The J-V characteristics and power-conversion efficiencies of the devices were measured using an Oriel 150-W solar simulator equipped with AMLSG filters (Newport), and corrected to reference 1 sun (100 mW/cm²) AM 1.5 G irradiation following standard spectral mismatch correction procedures. For each set of conditions, data from 3-4 detectors were obtained to ensure reproducibility of the results.

When measuring the I-V characteristics of the solar cells, the sample was pressed against a metal plate with a 1.23 mm diameter aperture to restrict illumination only to the active area of the 1-mm diameter devices. Calculation of organic solar cells' photocurrent with their spectral mismatch factors correct to that of standard 100 mW/cm² AM 1.5 G illumination is based upon the reference AM 1.5 G irradiation $E_{Ref}(\lambda)$, NREL calibrated spectral responsivity $S_R(\lambda)$ of a Si reference cell (Device ID: PVM42), solar simulator output spectra $E_S(\lambda)$ and the device EQE spectra $S_T(\lambda)$. The spectral mismatch correction factor (M) over the wavelength domain $\{\lambda_1, \lambda_2\}$ can be calculated using:

$$M = \frac{\int_{\lambda_1}^{\lambda_2} E_{Ref}(\lambda) S_R(\lambda)\,d\lambda \int_{\lambda_1}^{\lambda_2} E_S(\lambda) S_T(\lambda)\,d\lambda}{\int_{\lambda_1}^{\lambda_2} E_{Ref}(\lambda) S_T(\lambda)\,d\lambda \int_{\lambda_1}^{\lambda_2} E_S(\lambda) S_R(\lambda)\,d\lambda}$$

For these CuPc/$C_{60}$ solar cells and the solar simulator, $\lambda_1$=300 nm and, $\lambda_2$=900 nm, so that $\{\lambda_1, \lambda_2\}$ covers the photo-response range of both the reference and organic cells. The calculation above yields M=0.88±0.02, consistent with results for similar cells. Then the photo current of the Si reference was measured under the simulated light while the lamp intensity was adjusted such that the effective irradiance ($E_{eff}$) equals the standard 1 sun (100 mW/cm²) intensity. Then:

$$E_{eff} = \frac{I^{R,S} M}{CN}$$

Figure 14A:
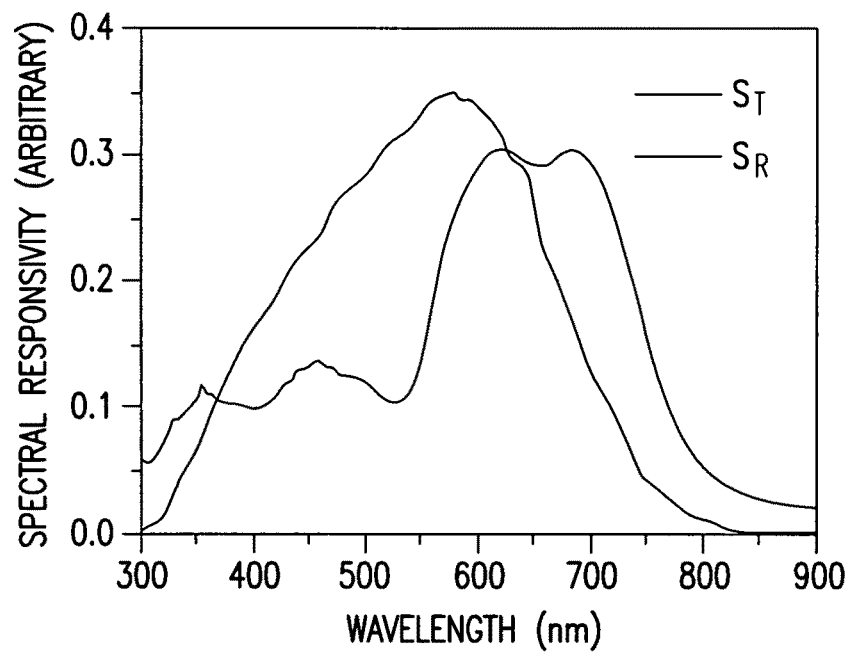
FIGS. 14a-14b depict spectral responsivity and spectral irradiance as a function of wavelength for a solar cell constructed according to an embodiment of the present invention.
Figure 14B:
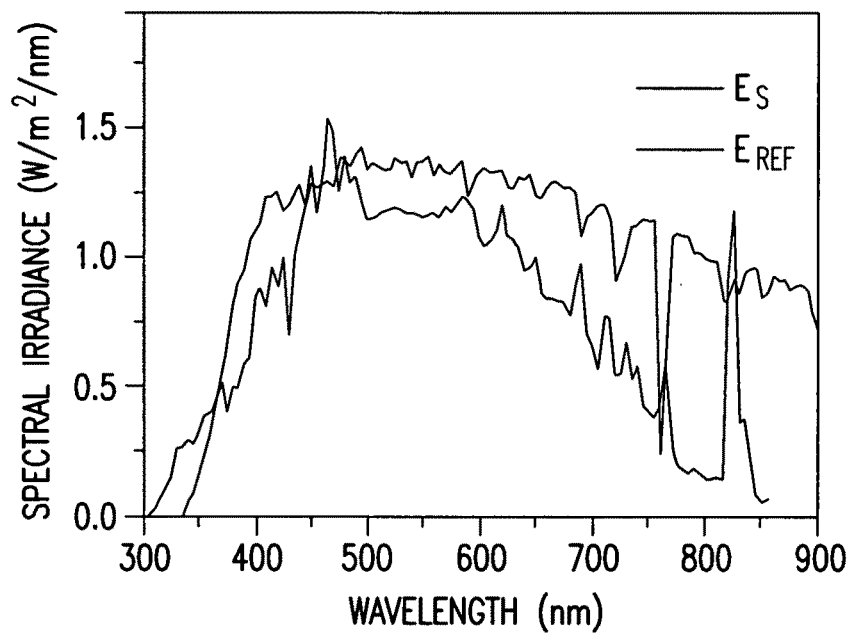

The adjustment yielded $E_{eff}$=100±4 mW/cm²). Here $I^{R,S}$ is the photocurrent of the reference cell measured with the solar simulator, and CN=0.113 A/W is the reference cell calibration number. The photocurrents of the organic solar cells were then corrected to the actual AM 1.5 G spectrum using the spectral mismatch factor M calculated as before. Thus, the corrected photocurrent of the organic cell ($I^{T,R}$) is:

$$I^{T,R} = \frac{I^{R,R} I^{T,S}}{I^{R,S} M}$$

where $I^{R,R}$ is the photo-current of the reference cell measured under standard AM 1.5 G irradiation, and $I^{T,S}$ is the photo current of the organic cells tested with the lab solar simulator. The spectral responsivity and spectral irradiance as a function of wavelength is shown in FIGS. 14a-14b.

Specific examples of the invention are illustrated and/or described herein. However, it will be appreciated that modifications and variations of the invention are covered by the above teachings and within the purview of the appended claims without departing from the spirit and scope of the invention.

What is claimed is:

1. A method of fabricating a photosensitive optoelectronic device, comprising:
   depositing a first organic semiconductor material over a first electrode to form a continuous first layer;
   depositing a second organic semiconductor material over the first layer to form a discontinuous second layer, portions of the first layer remaining exposed;
   depositing the first organic semiconductor material directly on the second layer to form a discontinuous third layer, portions of at least the second layer remaining exposed;
   alternating deposition of the first and second organic semiconductor materials;
   depositing the second organic semiconductor material to form a continuous fourth layer, and depositing a second electrode over the fourth layer,
wherein at least one of the first electrode and the second electrode is transparent, and
the first organic semiconductor material is one or more donor-type materials or one or more acceptor-type materials relative to the second organic semiconductor material, said second organic semiconductor material being one or more materials of the other material,
wherein at least one of the first and second organic semiconductor materials comprise nanocrystals.

2. The method of claim 1, wherein said first material is copper phthalocyanine and said second material is $C_{60}$.

3. The method of claim 2 wherein each of said first and second organic semiconductor materials are deposited via organic vapor phase deposition.

4. The method of claim 3 further comprising:
depositing an exciton blocking layer between said fourth layer and said second electrode.

5. The method of claim 1 wherein said first, second, third and fourth layers are part of a first organic photoactive region, the method further comprising:
forming a second photoactive region between said first photoactive region and said second electrode.

6. The method of claim 1 further comprising:
depositing additional first organic semiconductor material onto said first layer prior to depositing said second organic semiconductor material onto said first layer.

* * * * *